(12) United States Patent  
Shih

(10) Patent No.: US 6,739,682 B2
(45) Date of Patent: May 25, 2004

(54) SLIDE RAIL STRUCTURE FOR CASE CABINETS

(76) Inventor: Shoei-Yuan Shih, No. 8, Lane 85, Hsing-I Rd., Pei-Tou Dist., Taipei (TW)

( * ) Notice: Subject to any disclaimer, the term of this patent is extended or adjusted under 35 U.S.C. 154(b) by 83 days.

(21) Appl. No.: 10/067,261

(22) Filed: Feb. 7, 2002

(65) Prior Publication Data

US 2002/0084734 A1 Jul. 4, 2002

(51) Int. Cl.$^7$ .................... H05K 5/00; A47B 88/00
(52) U.S. Cl. .................. 312/334.4; 312/334.5; 312/223.1; 361/724; 361/727
(58) Field of Search .............. 312/334.4, 334.5, 312/223.1, 265.4; 211/26; 361/724, 725, 726, 727

(56) References Cited

U.S. PATENT DOCUMENTS

| | | | | |
|---|---|---|---|---|
| 3,133,768 A | * | 5/1964 | Klakovich | 384/17 |
| 5,833,337 A | * | 11/1998 | Kofstad | 312/334.5 |
| 5,941,621 A | * | 8/1999 | Boulay et al. | 312/334.4 |
| 6,070,957 A | * | 6/2000 | Zachrai | 312/334.4 |
| 6,230,903 B1 | * | 5/2001 | Abbott | 211/26 |
| 6,416,145 B1 | * | 7/2002 | Singh | 312/334.1 |
| 6,422,399 B1 | * | 7/2002 | Castillo et al. | 211/26 |
| 6,431,668 B1 | * | 8/2002 | Reddicliffe | 312/334.5 |
| 6,442,031 B1 | * | 8/2002 | Liu | 361/727 |
| 6,497,465 B1 | * | 12/2002 | Baker et al. | 312/334.4 |
| 6,501,020 B2 | * | 12/2002 | Grant et al. | 174/50 |
| 6,513,770 B1 | * | 2/2003 | Franz et al. | 248/200 |
| 6,554,142 B2 | * | 4/2003 | Gray | 211/26 |
| 6,557,960 B2 | * | 5/2003 | Shih | 312/334.5 |
| 2002/0074914 A1 | * | 6/2002 | Shih | 312/334.4 |
| 2002/0074915 A1 | * | 6/2002 | Shih | 312/334.5 |

* cited by examiner

Primary Examiner—Korie Chan
Assistant Examiner—Ingrid Weinhold
(74) Attorney, Agent, or Firm—Birch, Stewart, Kolasch & Birch, LLP

(57) ABSTRACT

A slide rail structure for a case cabinet includes a first slide member and a second slide member and a device case with an enlarged interior space. After the slide rail installed in the case cabinet and the device case contained desired hardware devices, the device case may be mounted on the slide rail to allow users to control operations of various peripheral devices.

20 Claims, 16 Drawing Sheets

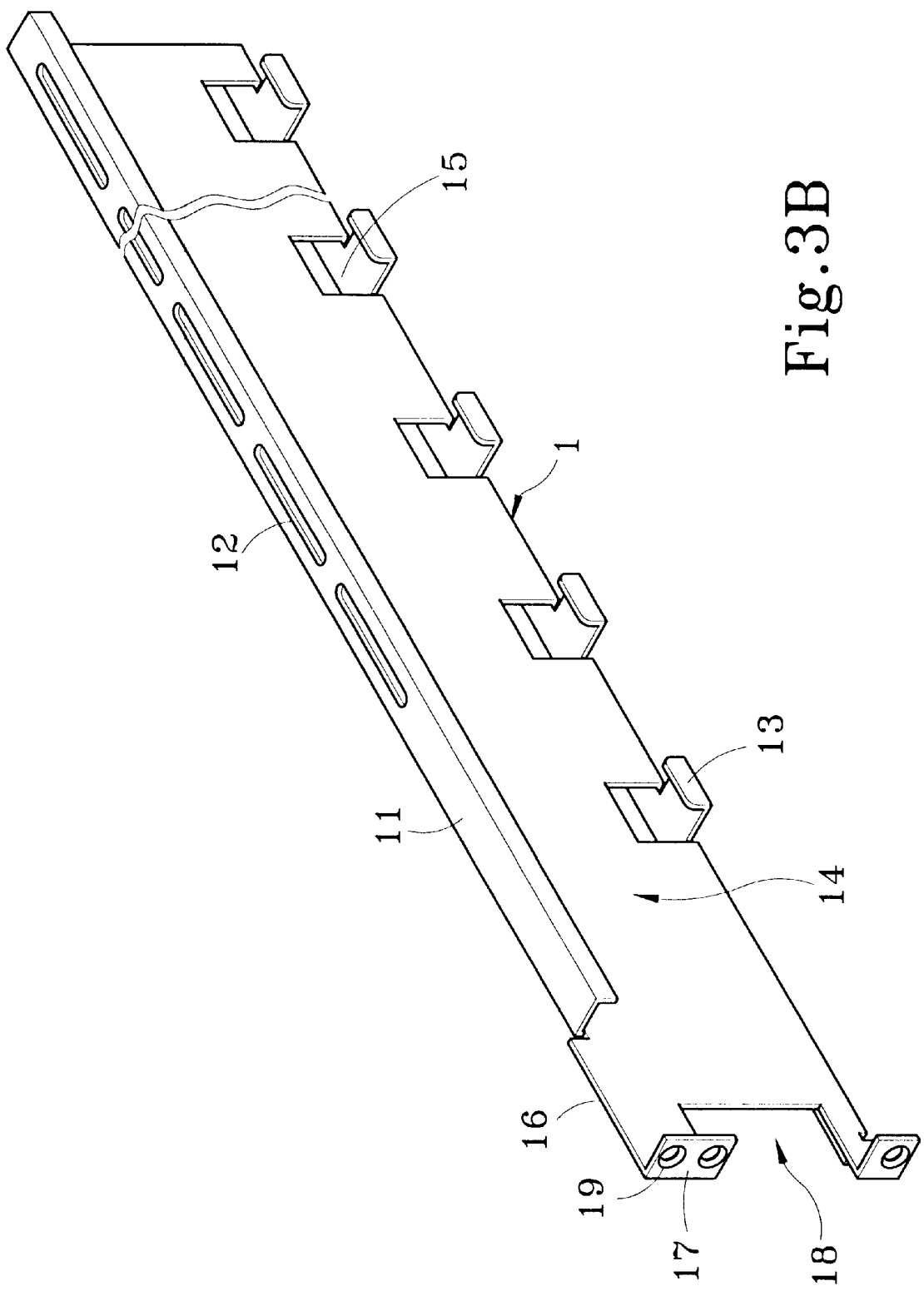

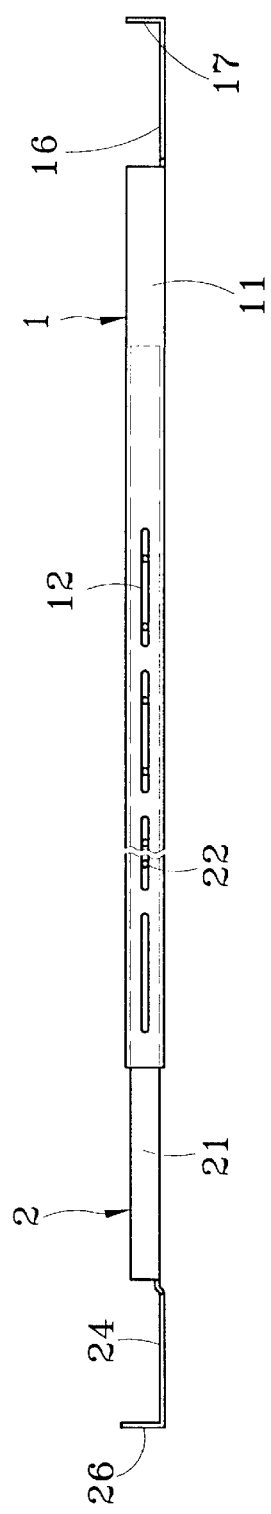
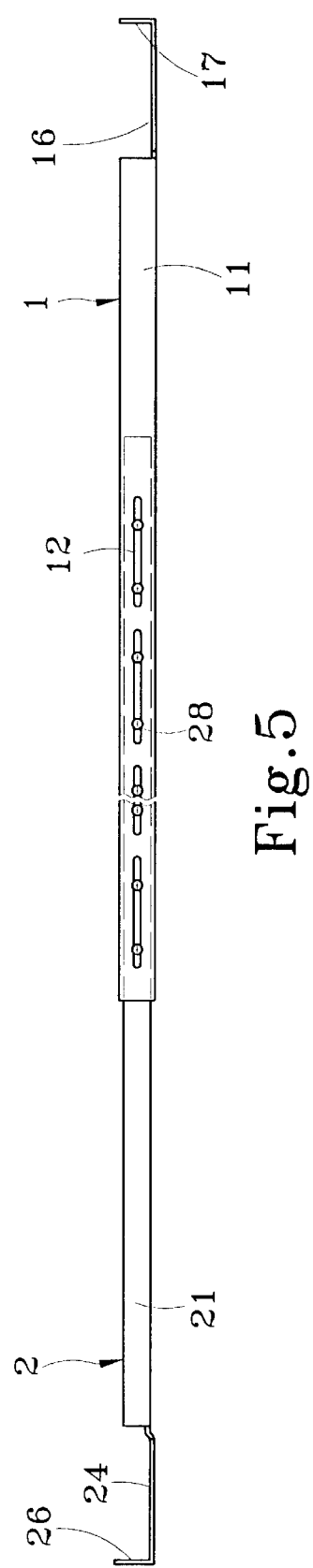

US 6,739,682 B2

SLIDE RAIL STRUCTURE FOR CASE CABINETS

FIELD OF THE INVENTION

The present invention relates to a slide rail structure for case cabinets and particularly to a slide rail for mounting a device case in a cabinet.

BACKGROUND OF THE INVENTION

Industrial computer processors now being commonly used generally adopt 1U, 2U or 4U specifications. Industrial servers made by different manufacturers have different case lengths. Matching server cabinets should also be made with different lengths to accommodate the servers. Hence conventional slide rails and anchor struts in the cabinets have to be altered to meet the changed server cabinets. As server cabinets are frequently changed to house the newly introduced servers and server cases, the slide rails and anchor struts also have to be changed frequently. This phenomenon incurs a lot of production cost increases. In the event of a slide rail or anchor strut damage, spare parts of the same type and dimensions for replacement are difficult to obtain because they usually are made to orders and by batches. It could cause annoying problems to users and manufacturers.

In addition, in order to meet configuration requirements of industrial servers, the matching anchor struts and slide rails also need to make height adjustments. A conventional server case cabinet has two end posts with displacement slots formed thereon for adjusting height for anchor struts and servers. Users have to measure installation locations for the computer processors then to position and anchor the computer processors. To provide displacement slots for anchoring the anchor struts at various locations adds more production costs. It also creates additional measuring work for users. It is not convenient or user-friendly.

Moreover, the device case 1a for a conventional server (as shown in FIG. 1) usually has two side walls 11a and a bottom section 12a bridging the two side walls 11a to form a housing chamber 13a for holding hardware such as a power supply, circuit boards and disk driver arrays. The device case 1a contained the hardware of the power supply, circuit boards and disk driver arrays then is installed in a case cabinet to allow users to control operations of various peripheral devices.

When the device case 1a is installed in the case cabinet, it is mounted on fixed L-type slide rails. In the event of hardware malfunction or hardware expansion is required, the device case 1a must be removed from the L-type slide rails for doing repairs and maintenance work or expansion for the hardware, then to mount and fasten again the device case 1a to the L-type slide rails in the case cabinet. It is time-consuming and troublesome.

Some producers have made the L-type slide rails extensible. The extensible slide rails make repairs and expansion of the hardware in the device case 1a more convenient. However the extensible slide rails and frames have more complex structures and take more space, as a result the housing space in the device case 1a for the hardware is shrunk. The device case 1a thus might be difficult to house all the hardware required, or the device case 1a cannot hold as many hardware as it originally does.

SUMMARY OF THE INVENTION

The primary object of the invention is to resolve aforesaid disadvantages. The invention provides a simpler slide rail structure inside a case cabinet to house server cases of different specifications and dimensions.

The foregoing, as well as additional objects, features and advantages of the invention will be more readily apparent from the following detailed description, which proceeds with reference to the accompanying, which are given by way of illustration only, and thus are not limitative of the present invention.

BRIEF DESCRIPTION OF THE DRAWINGS

FIG. 3B is another perspective view of the slide rail of the invention.

FIG. 4 is a top view of a slide rail of the invention under adjustment.

FIG. 5 is a top view of a slide rail of the invention.

DESCRIPTION OF THE PREFERRED EMBODIMENTS

Figure 1:
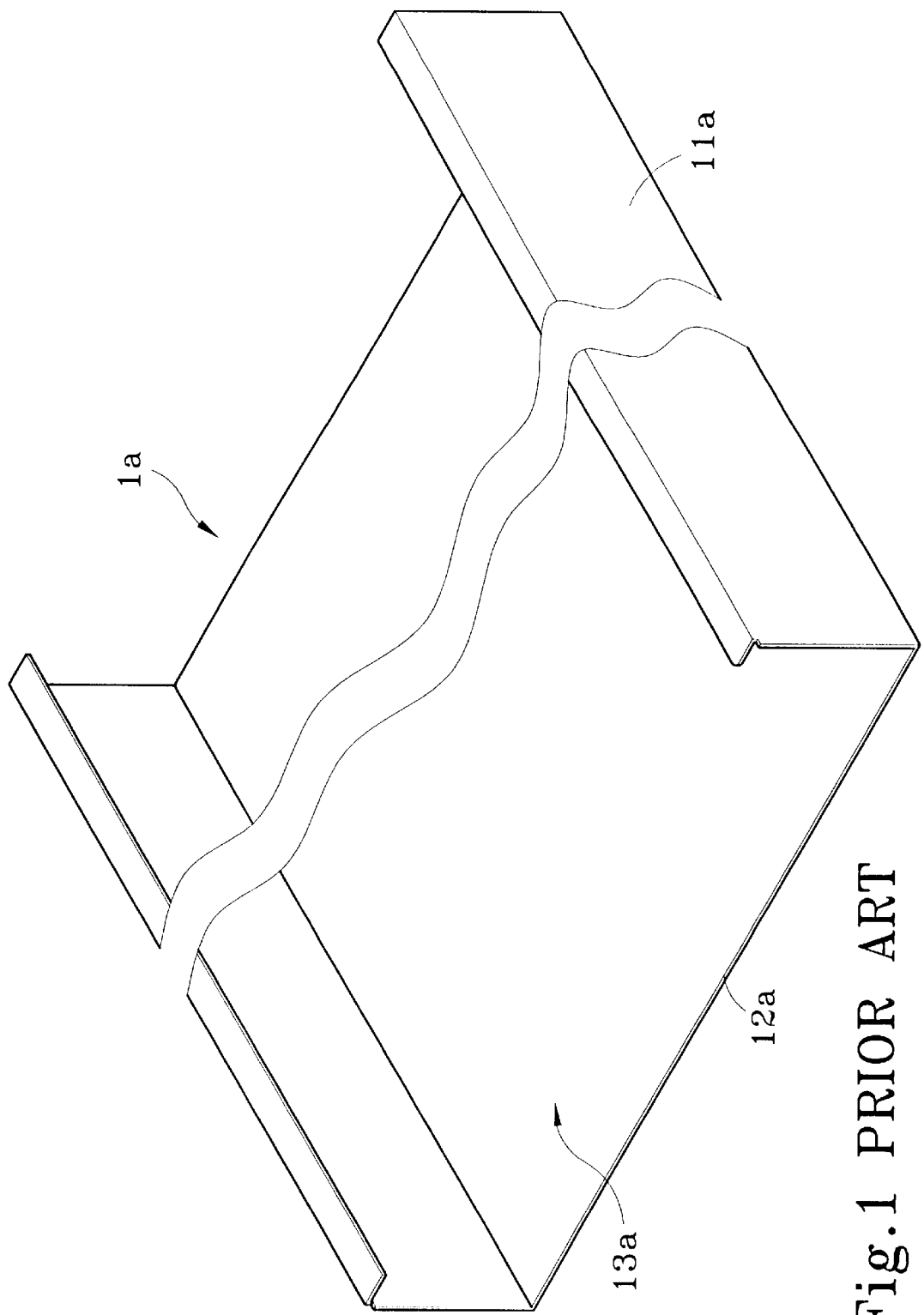
FIG. 1 a perspective view of a conventional device case.
Figure 2:
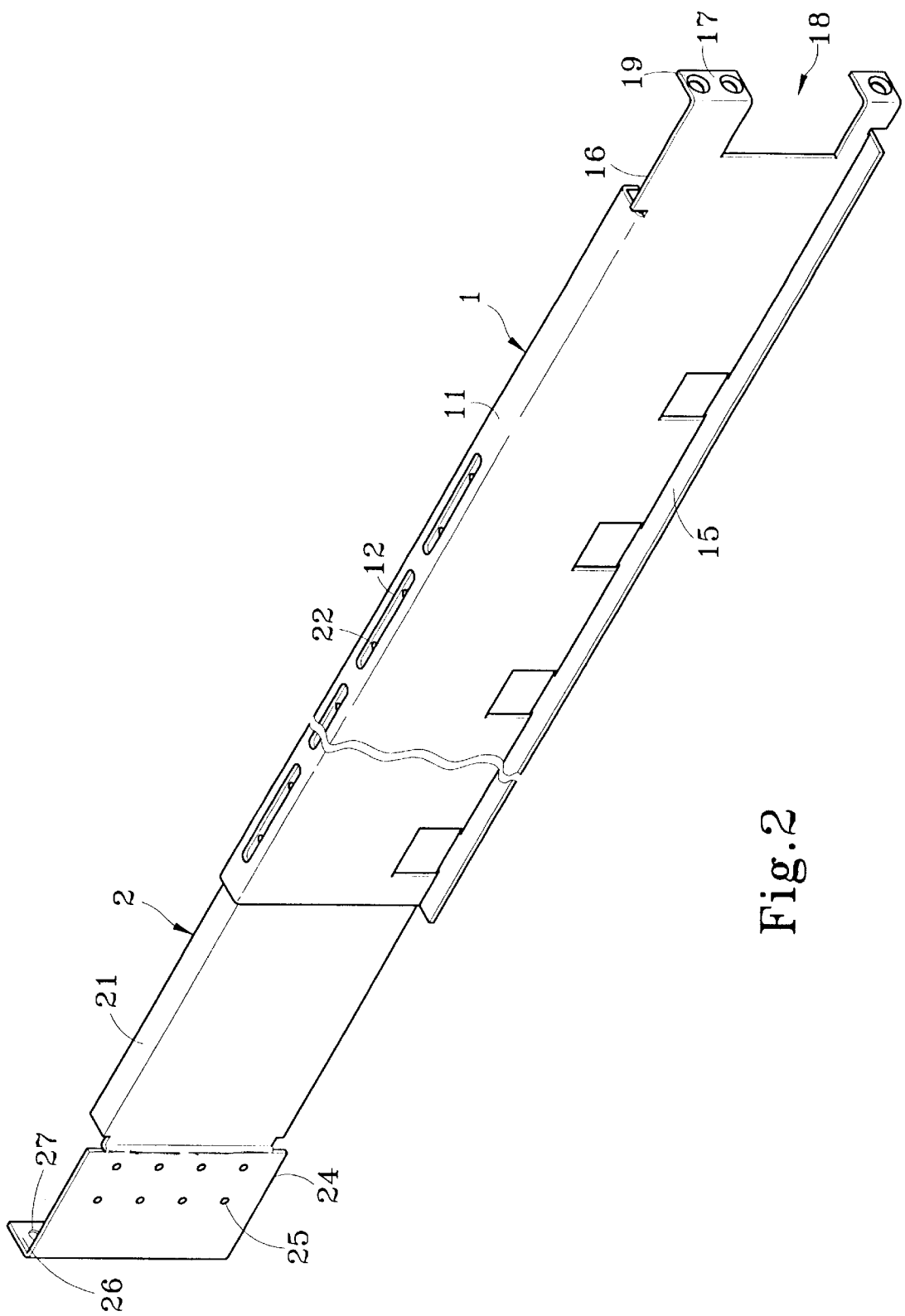
FIG. 2 is a perspective view of a slide rail of the invention.
Figure 3A:
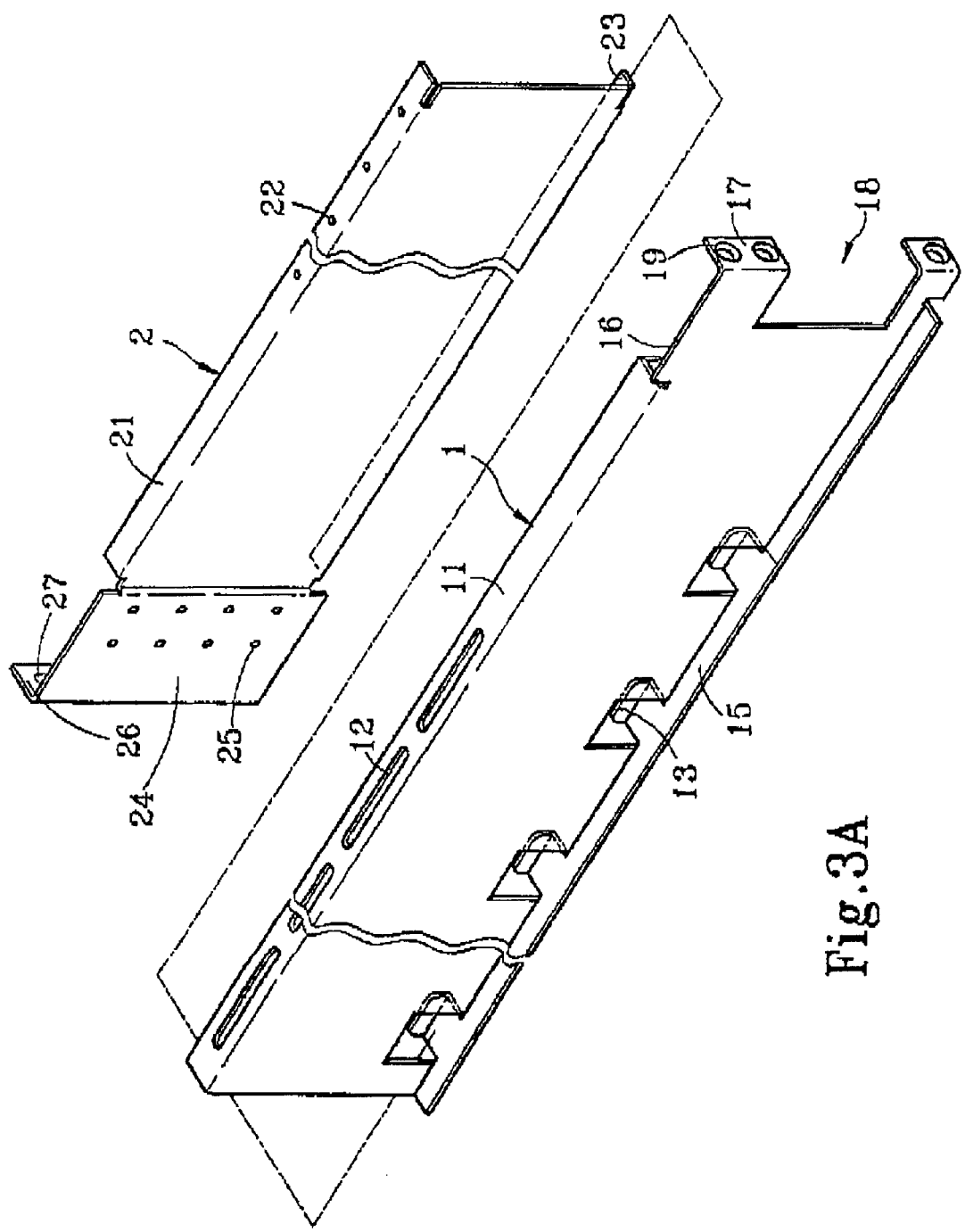
FIG. 3A is an exploded view of a slide rail of the invention.

Referring to FIGS. 2, 3A and 3B, the slide rail according to the invention includes a first slide member 1 and a second slide member 2 slidably engaging with the first slide member 1 for fastening to the interior of a case cabinet (not shown in the drawings) to hold server cases (not shown in the drawings) of different dimensions in the case cabinet to allow users to control operations of various peripheral devices.

The first slide member 1 has an upper end connecting a first bend section 11 which has at least one adjusting apertures 12 formed thereon, and a lower end connecting at least one second bend section 13 to form a slide space 14 with the first bend section 11. The lower end of the first slide member 1 further connecting a third bend section 15 on another side thereof. The first slide member 1 also has one end connecting a first extended section 16 which has a first fastening section 17 and a recess 18. The first fastening section 17 has at least one aperture 19 for fastening to the interior of the case cabinet.

The second slide member 2 is pivotally engaged in the slide space 14 and has an upper end connecting a fourth bend section 21 which has at least one aperture 22 formed thereon, and a lower end connecting a fifth bend section 23. The fourth and fifth bend sections 21, 23 are pivotally engaged with the first and second bend sections 11, 13 to allow the second slide member 2 to slide in the first slide member 1 for adjusting the length of the slide rail. The second slide rail member 2 further has one end connecting a second extended section 24 which has at least one aperture 25 formed thereon for fastening to the case cabinet. The second extended section 24 has one end connecting a second fastening section 26 which has at least one aperture 27 formed thereon for fastening to the interior of the case cabinet.

Referring to FIGS. 4 and 5 for installing the slide rail of the invention in a case cabinet, the first and second slide members 1, 2 may be stretched to a desired length to fit the case cabinet, then utilize fastening elements 28 to run through the adjusting apertures 12 of the first bend section 11 to engage with the apertures 22 on the fourth bend section 21 to adjust and fix the length of the slide rail at the desired length.

Figure 6:
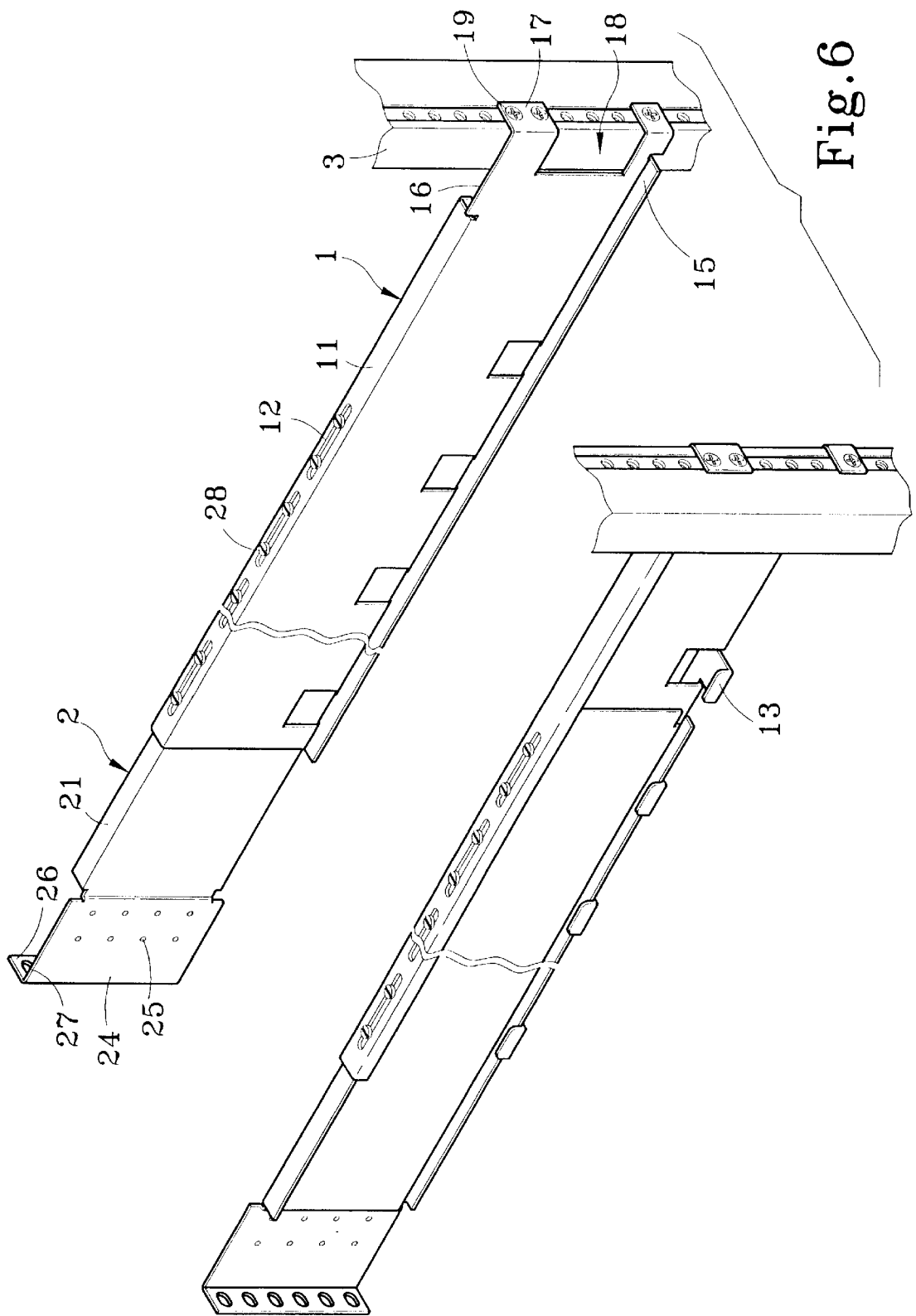
FIG. 6 is a schematic view of the slide rails of the invention fastened to a case cabinet.

Referring to FIG. 6, once the slide rail has been adjusted and fixed at the selected length, it may be fastened to a cabinet post 3 through engaging fastening elements 28 through apertures 19, 27 on the first and second fastening sections 17, 26 of the first and second extended sections 16, 24 for installing a device case.

Figure 7:
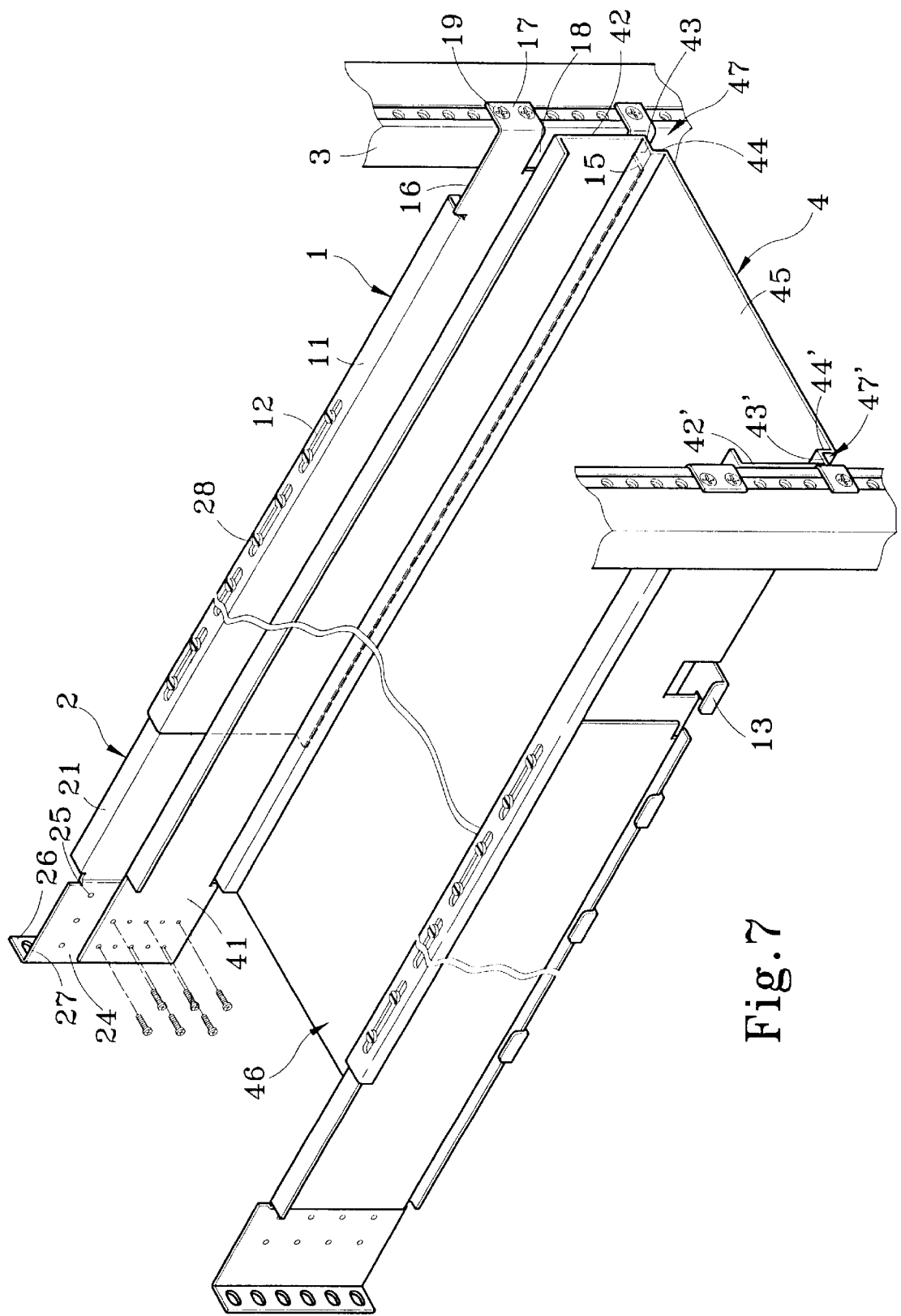
FIG. 7 is a schematic view of the slide rails of the invention fastened to a device case.
Figure 13:
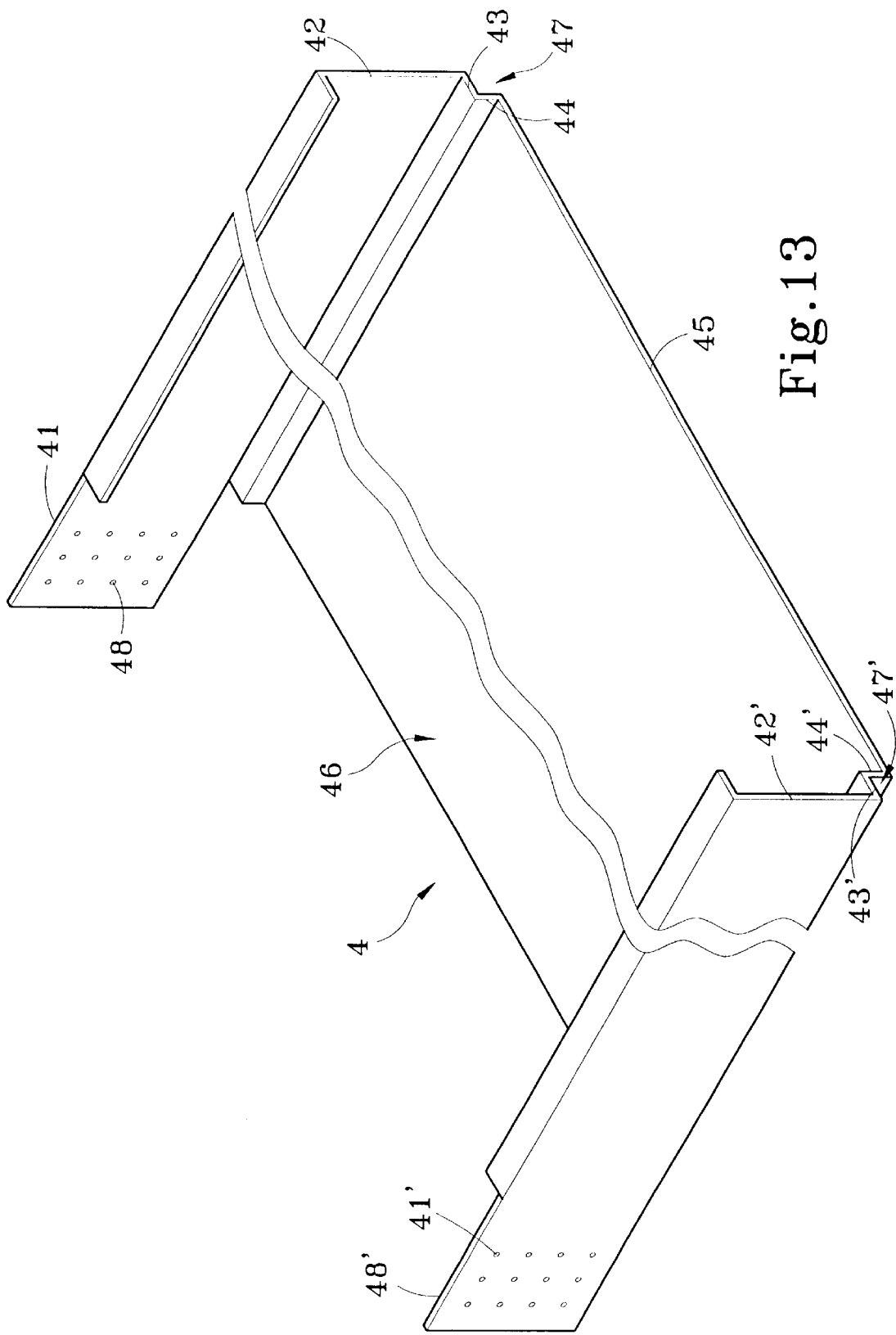
FIG. 13 is perspective view of a device case of the invention.
Figure 14:
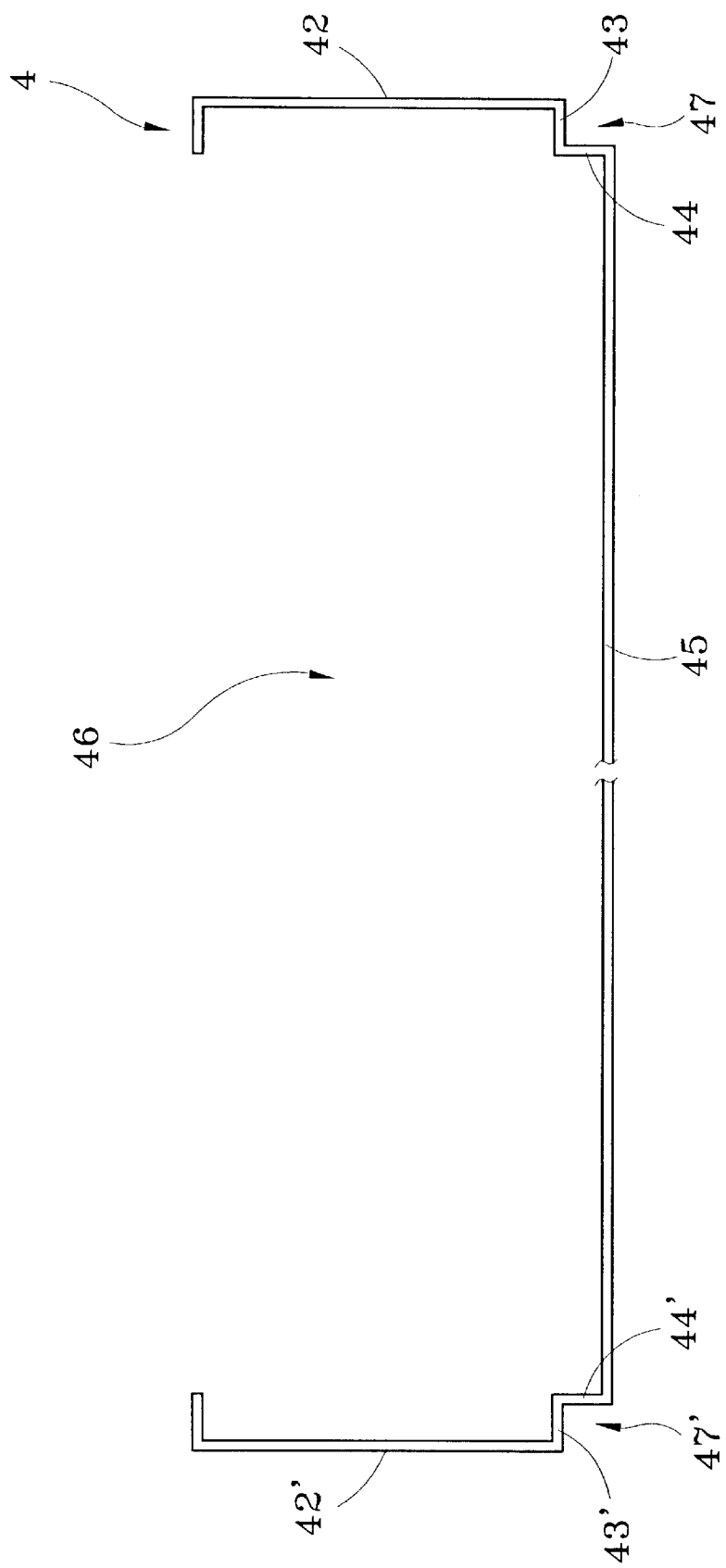
FIG. 14 is a front view of a device case of the invention.

Referring to FIGS. 7, 13, and 14, after the slide rails are fastened to the cabinet posts 3, the device case 4 may be installed on the slide rails. To do so, place the bottom section of the device case 4 on the third bend section 15 of the first slide rail member 1 and fasten an anchor section 41 of the device case 4 to the second extended section 24 of the second slide member 2 through engaging fastening elements 28 through the apertures 25 on the second extended section 24.

The device case 4 has two side walls 42, 42' each has a first flange 43, 43' which connects a second flange 44, 44'. The second flanges 44, 44' are bridged by a bottom section 45 for forming a housing chamber 46 between the two side walls 42, 42' to hold hardware such as a power supply, circuit boards and disk drive arrays and the like. The exterior of the first flanges 43, 43' and second flanges 44, 44' form indented coupling sections 47, 47' to straddle on various types of slide rails installed inside the case cabinet (not shown in the drawings). The anchor sections 41, 41' are extended from the side walls 42, 42' and have respectively a plurality of apertures 48, 48' formed thereon to allow the device case 4 be fastened to the interior of the case cabinet.

Because of the design of the first and second flanges 43, 43', 44, 44' on the industrial server case 4, the distance between the two side walls 42, 42' (housing chamber 46) can be enlarged for hardware expansion use and to hold more power supply, circuit boards and disk drive arrays and the like thereby to enhance control function of the peripheral devices.

Figure 8:
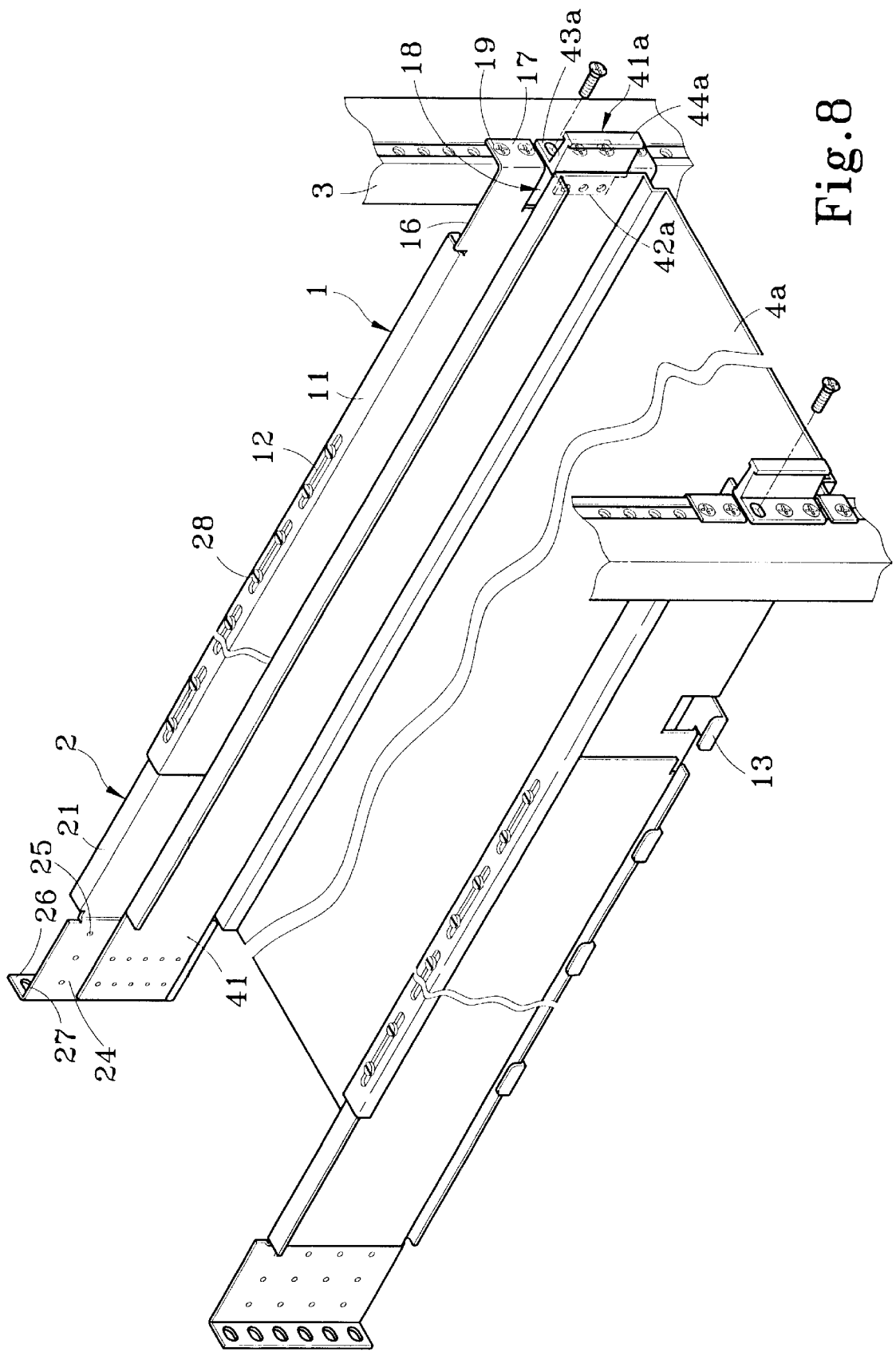
FIG. 8 is a schematic view of the slide rails of the invention fastened to a device case of 2U specifications or down.

Referring to FIG. 8 for the slide rail of the invention adopting for use on device cases of 2U specifications or down, the device case 4a for an industrial server of 2U or down has a first connection element 41a located on the front end thereof and over the recess 18 of the first slide member 1. The first connection element 41a has a first coupling section 42a for fastening to the device case 4a, and a second coupling section 43a opposite to the first coupling section 42a for fastening to the cabinet post 3, and a jutting section 44a located on another side away from the coupling sections 42a, 43a to allow users to grasp the device case 4a out for hardware expansion or repairs and maintenance.

Figure 9:
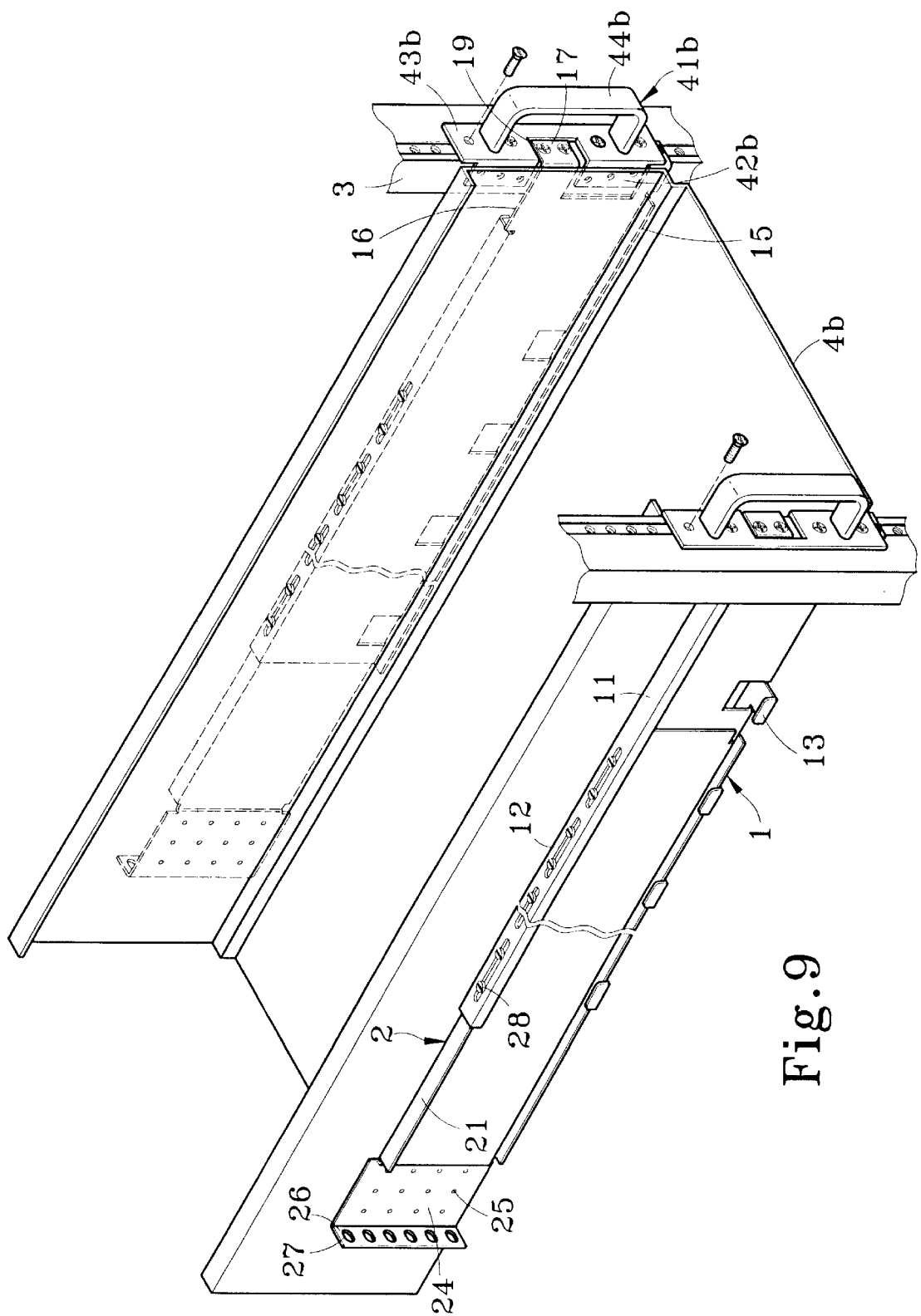
FIG. 9 is a schematic view of the slide rails of the invention fastened to a device case of 3U specifications or up.

Referring to FIG. 9 for the slide rail of the invention adopting for use on device cases of 3U specifications or up, the device case 4b for an industrial server of 3U or up has a second connection element 41b located on a front end thereof and straddled over the first fastening section 17 and the recess 18 of the first slide member 1. The second connection element 41b has a third coupling section 42b for fastening to the device case 4b, and a fourth coupling section 43b opposite to the third coupling section 42b for fastening to the cabinet post 3, and a handle 44b located on another side away from the coupling sections 42b, 43b to allow users to grasp the device case 4b out for hardware expansion or repairs and maintenance.

Figure 10:
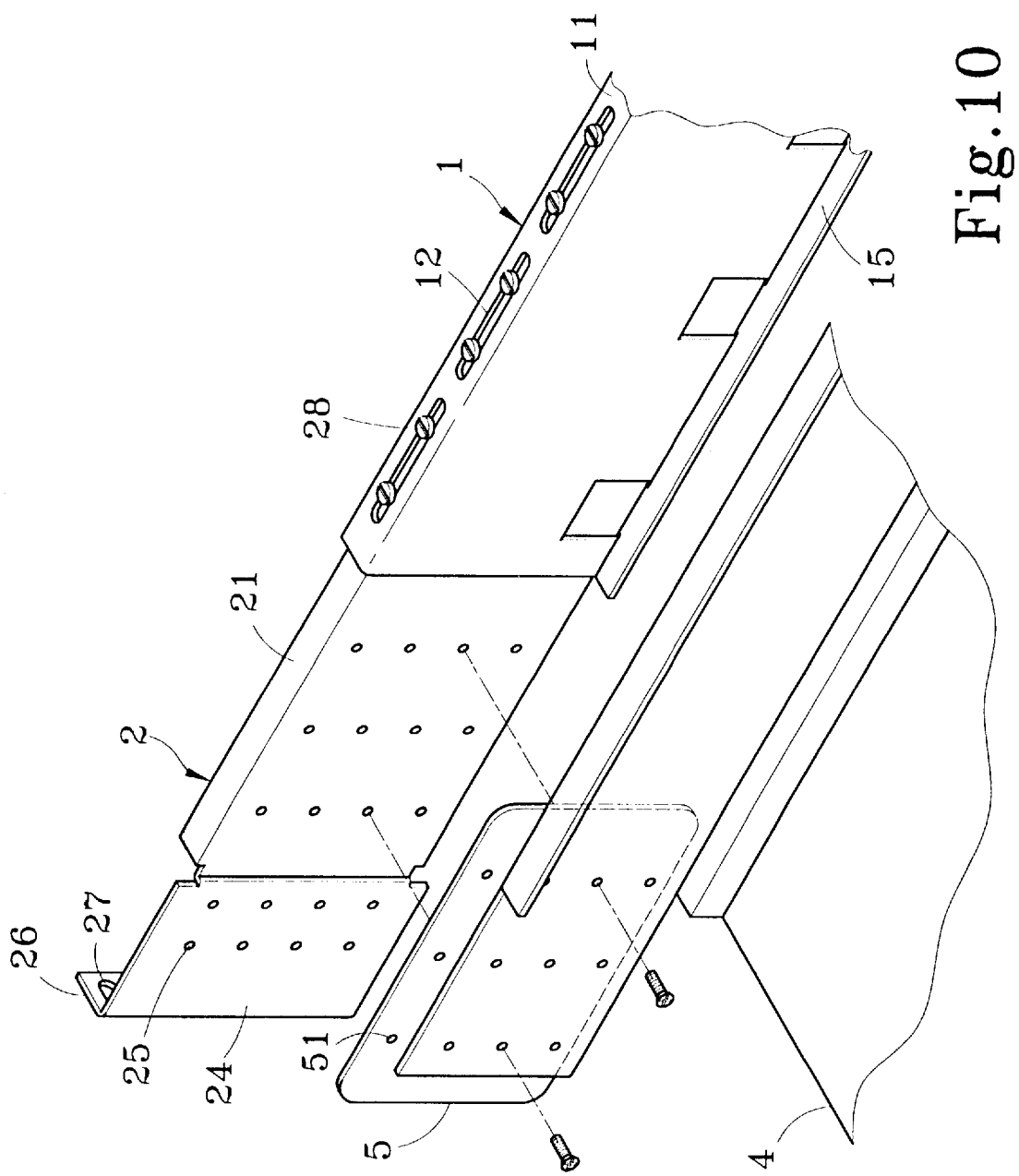
FIG. 10 is a schematic view of the slide rail of the invention fastened to a device case of a shorter length.

Referring to FIG. 10 for the slide rail of the invention to couple with a device case of a shorter length, the device case 4 to be fastened to the slide rails has a shorter length. For fastening, a coupling plate 5 is fastened to the interval of the first and second slide member 1, 2. The coupling plate 5 has at least one aperture 51 formed thereon to receive fastening elements 28 for fastening the device case 4 to the coupling plate 5.

Figure 11:
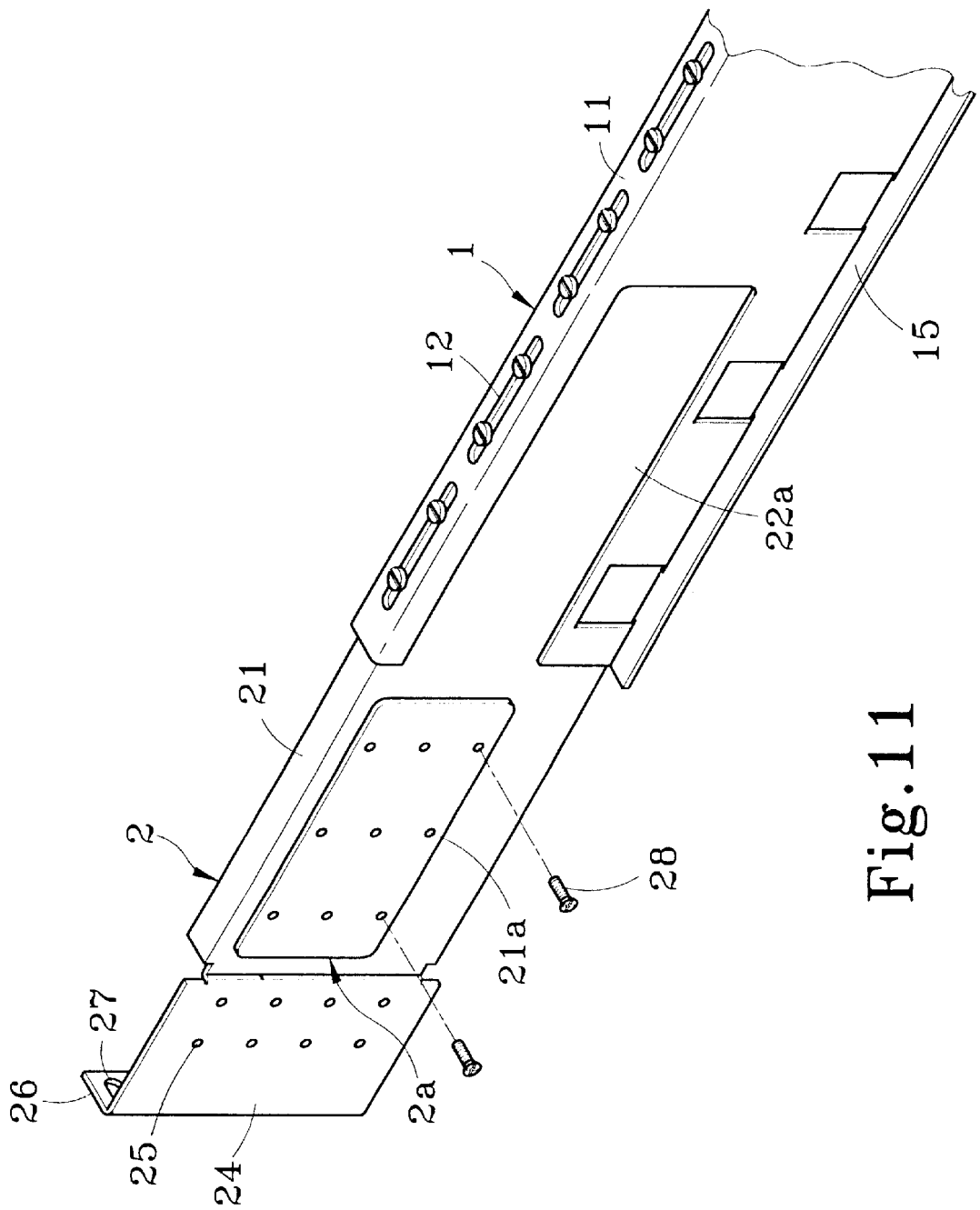
FIG. 11 is schematic view of another slide rail of the invention fastened to a device case of a shorter length.

Referring to FIG. 11 for another instance of the slide rail of the invention to couple with a device cast 4 of a shorter length, as shown in the drawing, the lateral side of the second slide member 2 is pressed to form a bulged section 2a which has at least one aperture 21a formed thereon. The first slide member 1 has a cut away channel 22a corresponding to the bulged section 2a and for housing the bulged section 2a. To adjust the length of the first and second slide members 1 and 2, the bulged section 2a may be moved in the cut away channel 22a until reaching a length desired. Then fastening elements 28 may be used to run through the apertures 21a for fastening the device case 4 to the slide rail.

Figure 12:
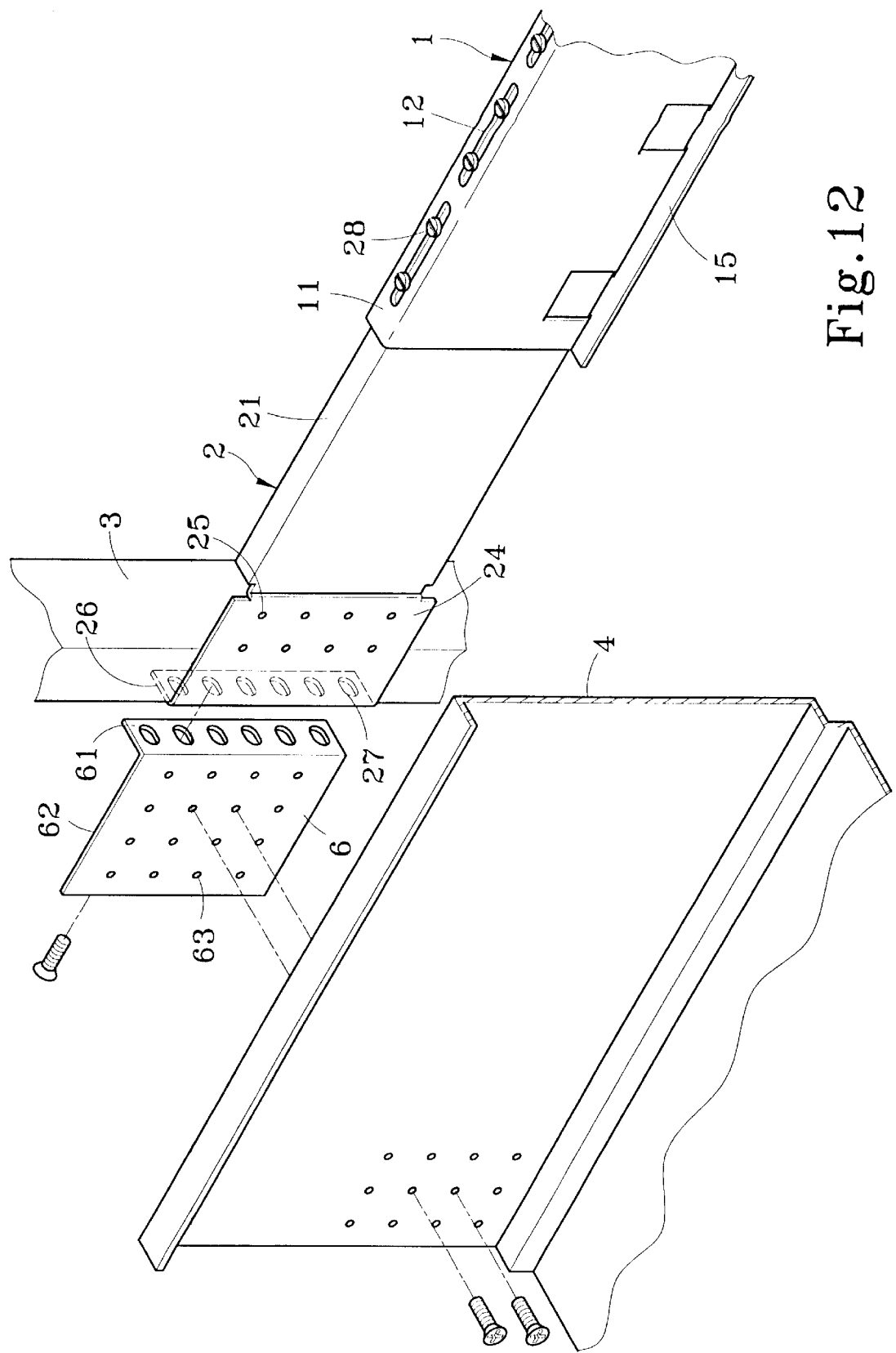
FIG. 12 is a schematic view of the slide rail of the invention fastened to a device case of a longer length.

Referring to FIG. 12 for the slide rail of the invention to couple with a device case 4 of a longer length, as shown in the drawing, the device case 4 has a longer length than the slide rail, the second extended section 26 of the second slide member 2 or cabinet post 3 may be connected with an extended element 6 which has a coupling section 61 connecting an anchoring section 62 with apertures 63 formed thereon. Through the apertures 63, the extended element 6 allows the device case 4 of a longer length fastening to the slide rail of the invention.

Figure 15:
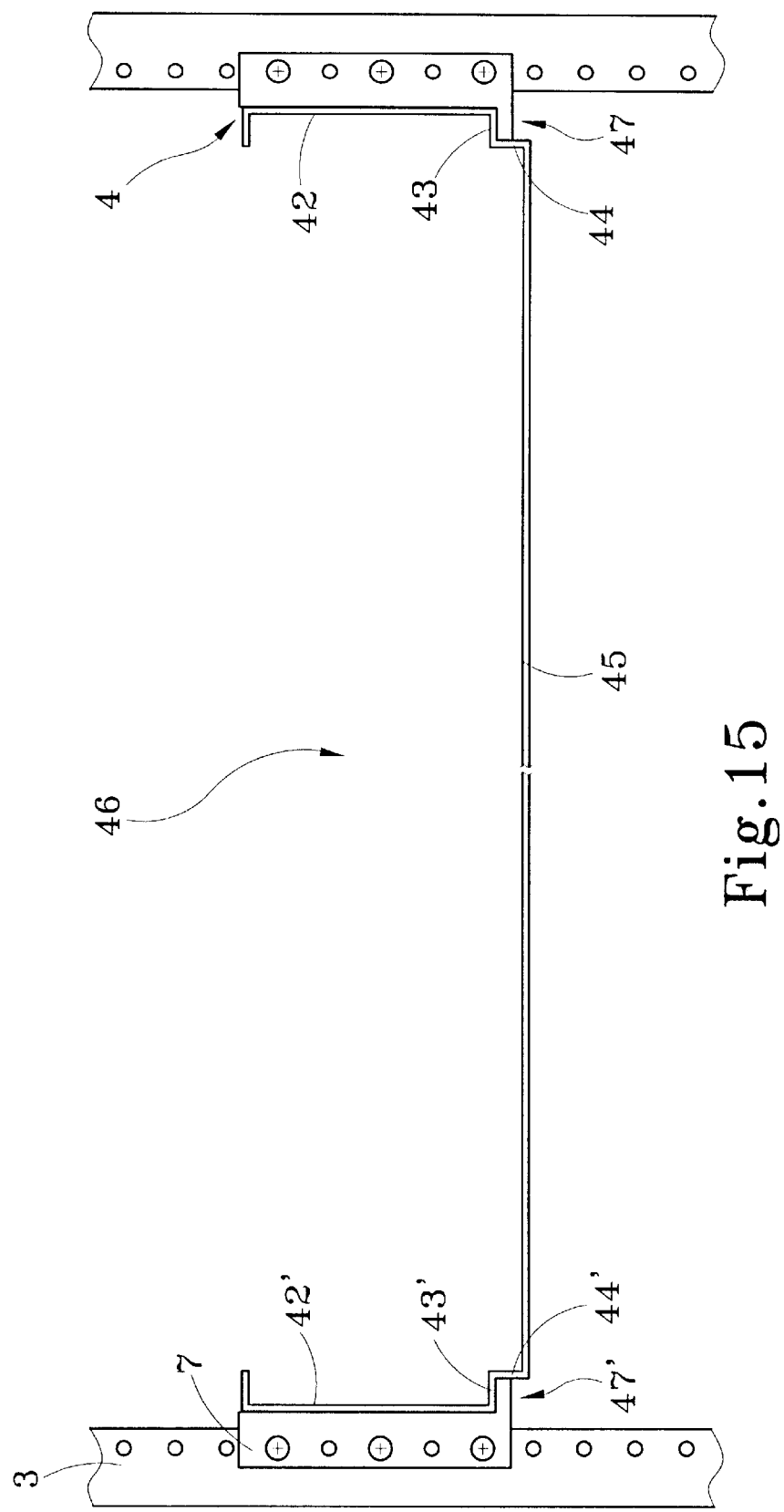
FIG. 15 is a schematic front view of the invention in use.

Referring to FIG. 15, when the invention is in use, various of hardware such as a power supply, circuit boards and disk driver arrays are installed in the device case 4, then the device case 4 may be installed in the case cabinet by mounting the indented coupling sections 47, 47' formed on exterior of the first and second flanges 43, 43', 44, 44' in a straddle manner on the slide rails 7 held on the cabinet post 3 such that the device case 4 may be held securely in the case cabinet.

Figure 16:
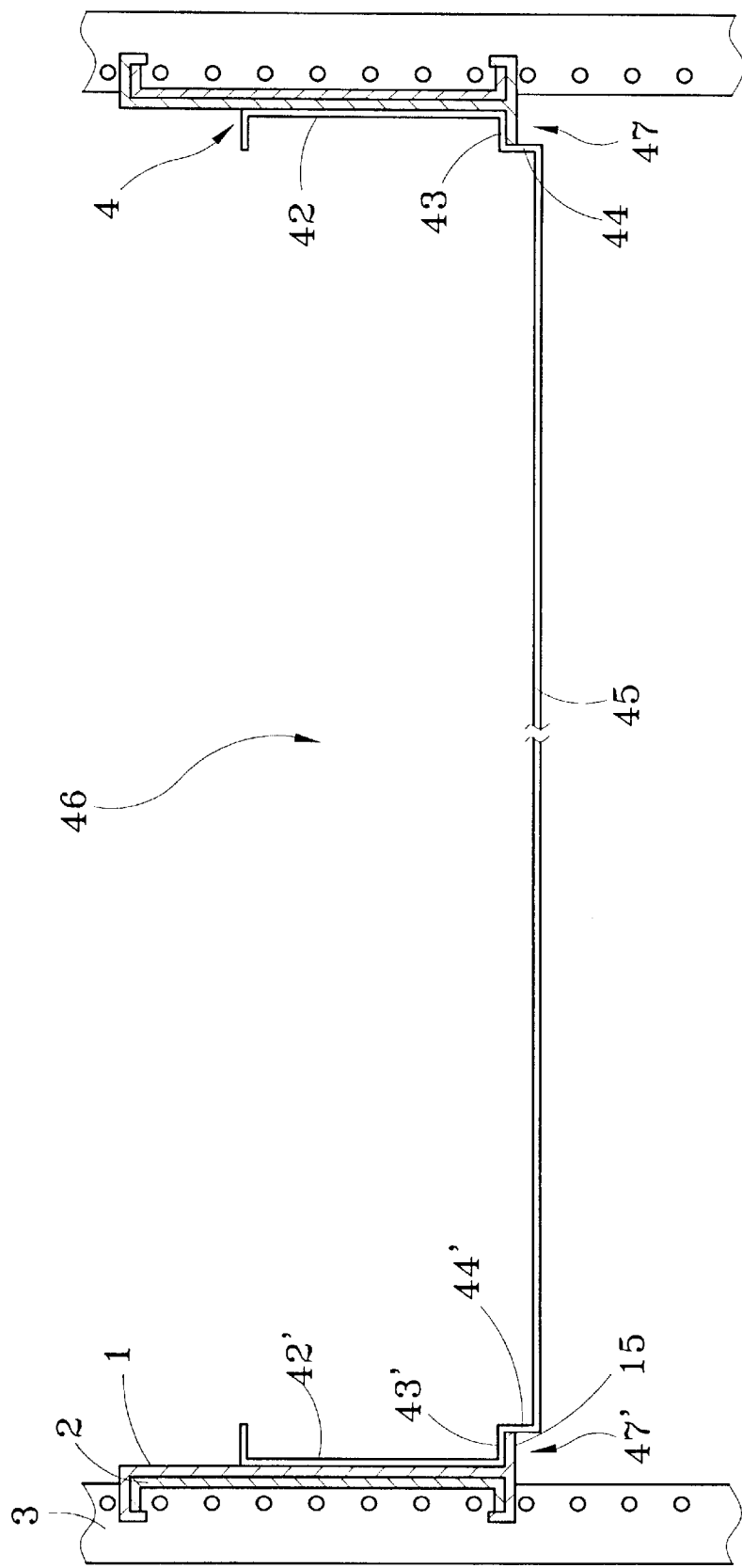
FIG. 16 is another schematic front view of the invention in use.

Referring to FIG. 16 for another use condition of the invention, the indented coupling sections 47, 47' formed on the exterior of the first and second flanges 43, 43', 44, 44' of the device case 4 may be mounted in a straddle manner on extensible slide rails (as shown in FIGS. 2, 3A and 3B) to allow the device case 4 be drawn out from the case cabinet without affecting extension or retraction displacement of the slide rails.

The invention being thus described, it will be obvious that the same may be varied in many ways. Such variations are not to be regarded as a departure from the spirit and scope of the invention, and all such modifications as would be obvious to one skilled in the art are intended to be included within the scope off the following claims.

What is claimed is:

1. A slide rail structure for a case cabinet, comprising:
    a first slide member having an upper end connecting a first bend section and a lower end connecting at least one second bend section to form a slide space with the first bend section, the lower end of the first slide member further connecting a third bend section on another side thereof, the first slide member having one end connecting a first extended section which has a first fastening section;
    a second slide member being slidably engaged in the slide space and having an upper end connecting a fourth bend section and a lower end connecting a fifth bend section, and one end connecting a second extended section which has at least one aperture and one end thereof connecting a second fastening section;
    wherein the first slide member and the second slide member are located in the case cabinet for fastening a device case of different specifications and dimensions to allow users to control operations of various peripheral devices; and
    wherein the fourth bend section has at least one aperture formed thereon.

2. The slide rail structure for a case cabinet of claim 1, wherein the first slide member has at least one adjusting aperture formed thereon.

3. The slide rail structure for a case cabinet of claim 1, wherein the first extended section of the first slide member has a recess.

4. The slide rail structure for a case cabinet of claim 1, wherein the first fastening section of the first slide member has at least one aperture formed thereon.

5. The slide rail structure for a case cabinet of claim 1, wherein the second fastening section of the second slide member has at least one aperture formed thereon.

6. The slide rail structure for a case cabinet of claim 1, wherein the device case is extended to form an anchor section.

7. The slide rail structure for a case cabinet of claim 1, wherein the slide rail structure is for fastening the device case of an industrial server of 2U or down, the device case having a front end connecting a first connection element which is located over the recess, the first connection element having a first coupling section for fastening to the device case and a second coupling section opposite to the first coupling section for fastening to the case cabinet, and a jutting section located on another side away from the first and the second coupling sections.

8. The slide rail structure for a case cabinet of claim 1, wherein the slide rail structure is for fastening the device case of an industrial server of 3U or up, the device case having a front end connecting a second connection element which is straddled over the first fastening section and the recess of the first slide member, the second connection element having a third coupling section for fastening to the device case, and a fourth coupling section opposite to the third coupling section for fastening to the case cabinet, and a handle located on another side away from the third and the fourth coupling sections.

9. The slide rail structure for a case cabinet of claim 1, wherein the device case fastened to the slide rail structure is shorter than the slide rail, the first and the second slide member having an interval formed therebetween which is fastened to a coupling plate which has at least one aperture formed thereon.

10. The slide rail structure for a case cabinet of claim 1, wherein the device case fastened to the slide rail structure is shorter than the slide rail, the second slide member having a lateral side pressed to form a bulged section which has at least one aperture formed thereon, the first slide member having a cut away channel corresponding to the bulged section for housing the bulged section.

11. The slide rail structure for a case cabinet of claim 1, wherein the device case fastened to the slide rail is structure longer than the slide rail, the second extended section of the second slide member or a cabinet post being connected with an extended element which has a coupling section for fastening to the second extended section of the second slide member or the cabinet post, the coupling section connecting an anchoring section which has apertures formed thereon for fastening to the device case.

12. The slide rail structure for a case cabinet of claim 1, wherein the device case has two side walls each having a first flange which connects a second flange, the second flanges being bridged by a bottom section for forming a housing chamber between the two side walls, the first flanges and the second flanges having an exterior forming a coupling section.

13. A slide rail structure for a case cabinet, comprising:
    a first slide member having an upper end connecting a first bend section and a lower end connecting at least one second bend section to form a slide space with the first bend section, the lower end of the first slide member further connecting a third bend section on another side thereof, the first slide member having one end connecting a first extended section which has a first fastening section;
    a second slide member being slidably engaged in the slide space and having an upper end connecting a fourth bend section and a lower end connecting a fifth bend section, and one end connecting a second extended section which has at least one aperture and one end thereof connecting a second fastening section;
    wherein the first slide member and the second slide member are located in the case cabinet for fastening a device case of different specifications and dimensions to allow users to control operations of various peripheral devices; and
    wherein the second fastening section of the second slide member has at least one aperture found thereon.

14. The slide rail structure for a case cabinet of claim 13, wherein the slide rail structure is for fastening the device case of an industrial server of 2U or down, the device case having a front end connecting a first connection element which is located over the recess, the first connection element having a first coupling section for fastening to the device case and a second coupling section opposite to the first coupling section for fastening to the case cabinet, and a jutting section located on another side away from the first and the second coupling sections.

15. The slide rail structure for a case cabinet of claim 14, wherein the slide rail structure is for fastening the device case of an industrial server of 3U or up, the device case having a front end connecting a second connection element which is straddled over the first fastening section and the recess of the first slide member, the second connection element having a third coupling section for fastening to the device case, and a fourth coupling section opposite to the third coupling section for fastening to the case cabinet, and a handle located on another side away from the third and the fourth coupling sections.

16. The slide rail structure for a case cabinet of claim 13, wherein the device case has two side walls each having a first flange which connects a second flange, the second flanges being bridged by a bottom section for forming a housing chamber between the two side walls, the first flanges and the second flanges having an exterior forming a coupling section.

17. A slide rail structure for a case cabinet, comprising:

a first slide member having an upper end connecting a first bend section and a lower end connecting at least one second bend section to form a slide space with the first bend section, the lower end of the first slide member further connecting a third bend section on another side thereof, the first slide member having one end connecting a first extended section which has a first fastening section;

a second slide member being slidably engaged in the slide space and having an upper end connecting a fourth bend section and a lower end connecting a fifth bend section, and one end connecting a second extended section which has at least one aperture and one end thereof connecting a second fastening section;

wherein the first slide member and the second slide member are located in the case cabinet for fastening a device case of different specifications and dimensions to allow users to control operations of various peripheral devices; and wherein the device case fastened to the slide rail structure is shorter than the slide rail, the first and second slide member having an interval formed therebetween which is fastened to a coupling plate which has at least one aperture formed thereon.

18. The slide rail structure for a case cabinet of claim 17, wherein the slide rail structure is for fastening the device case of an industrial server of 2U or down, the device case having a front end connecting a first connection element which is located over the recess, the first connection element having a first coupling section for fastening to the device case and a second coupling section opposite to the first coupling section for fastening to the case cabinet, and a jutting section located on another side away from the first and the second coupling sections.

19. The slide rail structure for a case cabinet of claim 17, wherein the slide rail structure is for fastening the device case of an industrial server of 3U or up, the device case having a front end connecting a second connection element which is straddled rover the first fastening section and the recess of the first slide member, the second connection element having a third coupling section for fastening to the device case, and a fourth coupling section opposite to the third coupling section for fastening to the case cabinet, and a handle located on another side away from the third and the fourth coupling sections.

20. The slide rail structure for a case cabinet of claim 17, wherein the device case has two side walls each having a first flange which connects a second flange, the second flanges being bridged by a bottom section for forming a housing chamber between the two side walls, the first flanges and the second flanges having an exterior forming a coupling section.

* * * * *